(12) United States Patent
Liu et al.

(10) Patent No.: US 7,277,351 B2
(45) Date of Patent: Oct. 2, 2007

(54) PROGRAMMABLE LOGIC DEVICE MEMORY ELEMENTS WITH ELEVATED POWER SUPPLY LEVELS

(75) Inventors: Lin-Shih Liu, Fremont, CA (US); Mark T. Chan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 75 days.

(21) Appl. No.: 11/335,437

(22) Filed: Jan. 18, 2006

(65) Prior Publication Data

US 2007/0109899 A1 May 17, 2007

Related U.S. Application Data

(60) Provisional application No. 60/737,868, filed on Nov. 17, 2005.

(51) Int. Cl.
*G11C 5/14* (2006.01)
(52) U.S. Cl. .................. 365/226; 365/230.06; 365/240
(58) Field of Classification Search ................ 365/226, 365/227, 230.06, 239–240; 326/38–41
See application file for complete search history.

(56) References Cited

U.S. PATENT DOCUMENTS

| | | | |
|---|---|---|---|
| 5,122,846 A | 6/1992 | Haken | |
| 5,642,315 A | 6/1997 | Yamaguchi | |
| 5,801,551 A | 9/1998 | Lin | |
| 5,920,201 A | 7/1999 | Mehrotra et al. | |
| 6,025,737 A | 2/2000 | Patel et al. | |
| 6,114,843 A | 9/2000 | Olah | |
| 6,232,893 B1 | 5/2001 | Cliff et al. | |
| 6,433,585 B1 | 8/2002 | Patel et al. | |
| 6,724,222 B2 | 4/2004 | Patel et al. | |
| 6,795,332 B2 | 9/2004 | Yamaoka et al. | |
| 6,897,679 B2 | 5/2005 | Cliff et al. | |
| 2004/0093529 A1* | 5/2004 | Devlin et al. | 713/300 |
| 2007/0109017 A1* | 5/2007 | Liu et al. | 326/41 |
| 2007/0113106 A1* | 5/2007 | Liu et al. | 713/300 |

* cited by examiner

*Primary Examiner*—Richard T. Elms
*Assistant Examiner*—Hien Nguyen
(74) *Attorney, Agent, or Firm*—G. Victor Treyz

(57) ABSTRACT

Programmable logic device integrated circuits are provided. The programmable logic device integrated circuits contain programmable core logic powered at a programmable core logic power supply voltage. Programmable logic device configuration data is loaded into the memory elements to configure the programmable core logic to perform a custom logic function. During normal operation the memory elements may be powered with a power supply voltage that is larger than the programmable core logic power supply voltage. During data loading operations, the memory elements may be powered with a power supply voltage equal to the programmable core logic power supply voltage. Data loading and reading circuitry loads data into the memory elements and reads data from the memory elements. Address signals are generated by the data loading and reading circuitry. The address signals may have larger voltage levels during data writing operations than during read operations.

20 Claims, 13 Drawing Sheets

PROGRAMMABLE LOGIC DEVICE MEMORY ELEMENTS WITH ELEVATED POWER SUPPLY LEVELS

This application claims the benefit of provisional patent application No. 60/737,868, filed Nov. 17, 2005, which is hereby incorporated by reference herein in its entirety.

BACKGROUND

This invention relates to memory elements, and more particularly, to volatile memory elements that have elevated output voltages for integrated circuits such as programmable logic devices.

Integrated circuits often contain volatile memory elements. Typical volatile memory elements are based on cross-coupled inverters (latches) and are used to store data. Each memory element can store a single bit of data.

Volatile memory elements are often used to store configuration data in programmable logic devices. Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Conventional programmable logic device memory elements are powered at a positive power supply voltage. The positive power supply voltage that is used to power conventional programmable logic device memory elements is typically referred to as Vcc or Vcc-core and is the same power supply voltage used to power the core logic in the programmable logic device.

Integrated circuits such as programmable logic device integrated circuits that operate at low values of Vcc offer benefits over integrated circuits that operate at higher values of Vcc. For example, reductions in Vcc generally lead to reduced power consumption. Because of these benefits, the semiconductor industry is continually striving to produce processes and circuit designs that support reductions in Vcc. Previous generations of programmable logic devices operated at Vcc levels of 2.0 volts, 1.8 volts, and 1.5 volts. More recently, Vcc levels of 1.2 volts have been used in programmable logic devices. It is expected that future programmable logic devices will support Vcc levels of less than 1.2 volts (e.g., 1.1 volts or 1.0 volts).

The memory elements in a programmable logic device produce static output signals that reflect the configuration data that has been loaded into the memory elements. The static output signals drive the gates of n-channel and p-channel metal-oxide-semiconductor (MOS) transistors. Some of the transistors such as the n-channel transistors are used as pass transistors and are incorporated into multiplexers and other logic components. P-channel transistors are sometimes used as power-down transistors that prevent power from being applied to unused portions of an integrated circuit. Both n-channel and p-channel transistors operate poorly when they are driven at insufficient voltages. For example, if the gate of an n-channel pass transistor receives a voltage that is too low, the transistor will not turn on properly and will degrade logic signals passing through the transistor. If the gate of a p-channel power-down transistor is too low, the transistor will not turn off properly and will exhibit an undesirably large leakage current.

It would therefore be desirable to be able to provide programmable logic device integrated circuits that operate well at low core logic power supply levels.

SUMMARY

In accordance with the present invention, programmable logic device integrated circuits are provided that contain programmable core logic. Configuration data is loaded into an array of memory elements. The loaded memory elements produce control signals that configure the core logic to produce a custom logic function.

Data loading and reading circuitry is used to address the memory elements in the array. To reduce real estate requirements associated with the address transistors for the memory elements and/or to increase the write margin of the memory elements, address signals used during data writing operations may have voltages larger than the programmable core logic power supply voltage. During read operations, the address signals may be applied to the memory elements at a lower voltage such as the programmable core logic power supply voltage.

During normal operation, the memory elements may be powered using an elevated power supply voltage. During data loading operations the power supply level for the memory elements may be lowered to the programmable core logic power supply voltage.

Further features of the invention, its nature and various advantages will be more apparent from the accompanying drawings and the following detailed description.

DETAILED DESCRIPTION

The present invention relates to memory elements and integrated circuits that contain memory elements. The invention also relates to circuits for loading data into memory elements and for confirming that the data has been loaded properly. The integrated circuits that contain the memory elements may be memory chips, digital signal processing circuits with memory arrays, microprocessors, application specific integrated circuits with memory arrays, programmable logic device integrated circuits in which memory elements are used for configuration memory, or any other suitable integrated circuits. For clarity, the present invention will generally be described in the context of programmable logic device integrated circuits in which volatile memory elements are used to store configuration data.

During the programming of a programmable logic device, configuration data is loaded into the memory elements. During operation of the programmable logic device, each memory element provides a static output signal. The outputs signals from the memory elements are applied to programmable logic and customize the programmable logic to perform a desired logic function. In a typical arrangement, each static output signal serves as a control signal that is applied to the gate of an n-channel or p-channel metal-oxide-semiconductor transistor.

The programmable logic in which the n-channel and p-channel transistors are contained makes up part of the logic core of the programmable logic device and is therefore sometimes referred to as programmable core logic. Core logic is powered using a positive power supply voltage that is generally referred to as Vcc and a ground voltage that is generally referred to as Vss.

To reduce power consumption, there is an ongoing trend in the semiconductor industry to reduce the magnitude of Vcc. Reducing the core logic power supply voltage reduces power consumption, but can lead to design challenges. For example, n-channel transistors in the programmable core logic can be difficult to turn on completely and p-channel transistors in the core logic can be difficult to turn off completely.

In accordance with the present invention, an elevated power supply level may be used to power the programmable memory elements on a programmable logic device integrated circuit. The elevated power supply uses a positive power supply voltage of Vcchg and a ground voltage. With one suitable arrangement, the ground power supply voltage is Vss, which is the same value used in the core logic.

During normal device operation, the positive power supply voltage Vcchg is maintained at a value of Vcchg-high. As a result, the memory elements that contain logic ones produce output signals at Vcchg-high. The value of Vcchg-high is greater than Vcc, so n-channel transistors in the programmable core logic are turned on more fully and p-channel transistors in the programmable core logic are turned off more fully than would be possible if the memory elements were powered at Vcc.

Figure 1:
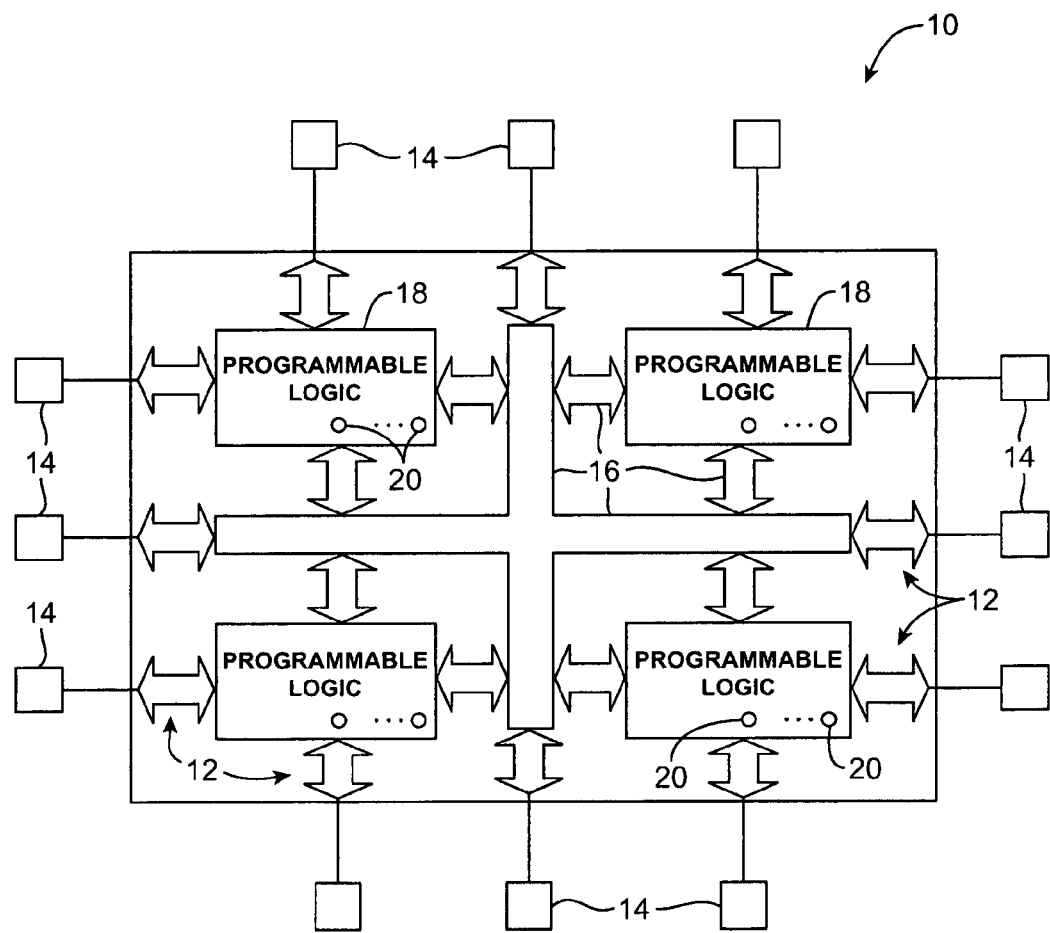
FIG. 1 is a diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally n-channel metal-oxide-semiconductor (NMOS) pass transistors in programmable components such as multiplexers. When a memory element output is high, the pass transistor controlled by that memory element is turned on and passes logic signals from its input to its output. When the memory element output is low, the pass transistor is turned off and does not pass logic signals.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from any suitable source. With one illustrative arrangement, the memory elements are loaded from an external erasable-programmable read-only memory and control chip called a configuration device via pins 14 and input/output circuitry 12. The output signals from the loaded memory elements 20 are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 are generally arranged in an array pattern. In a typical modern programmable logic device, there may be millions of memory elements 20 on each chip. During programming operations, the array of memory elements is provided with configuration data. Once loaded with configuration data, the memory elements 20 selectively control (e.g., turn on and off) portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
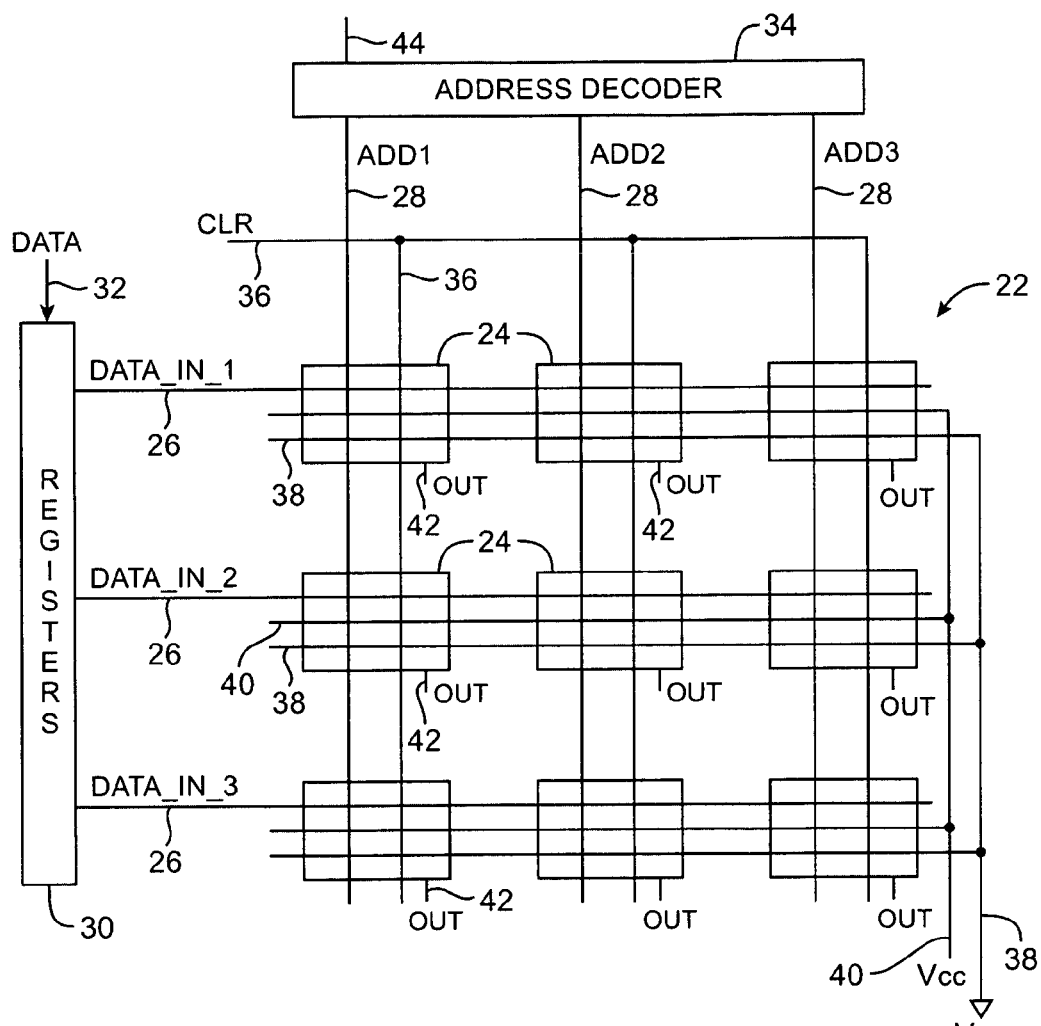
FIG. 2 is a diagram of a conventional array of programmable logic device memory elements.

When memory elements are arranged in an array, horizontal and vertical conductors and associated loading circuitry may be used to load the memory elements with configuration data. A conventional data loading arrangement is shown in FIG. 2. The arrangement of FIG. 2 has a 3×3 array 22 of memory elements 24. (Actual memory arrays typically have hundreds or thousands of rows and columns, but a 3×3 array is used as an example.) The array 22 receives power via positive power supply line 40 and ground line 38. The voltage Vcc on line 40 is typically 1.2 volts and the voltage Vss on ground line 38 is typically 0 volts.

A clear line 36 (labeled CLR) is used to clear the contents of the memory array 22. After the array has been cleared, configuration data may be loaded.

Configuration data is provided in series to registers 30 via input 32. The configuration data is then provided in parallel to array 22 via the DATA_IN_1, DATA_IN_2, and DATA_IN_3 lines 26. Address decoder 34 receives addressing information via input 44. In response, the address decoder asserts a desired one of the address lines 28 (i.e., ADD1, ADD2, or ADD3). When an address line is asserted in a given column, the data on the data lines 26 is loaded into the memory elements 24 in that column. The array is filled by systematically loading the memory elements in each of the columns of the array. After the array has been completely loaded with configuration data, the output 42 of each memory element 24 produces a corresponding static control signal for controlling the gate of a pass transistor or other logic component on the programmable logic device.

Figure 3:
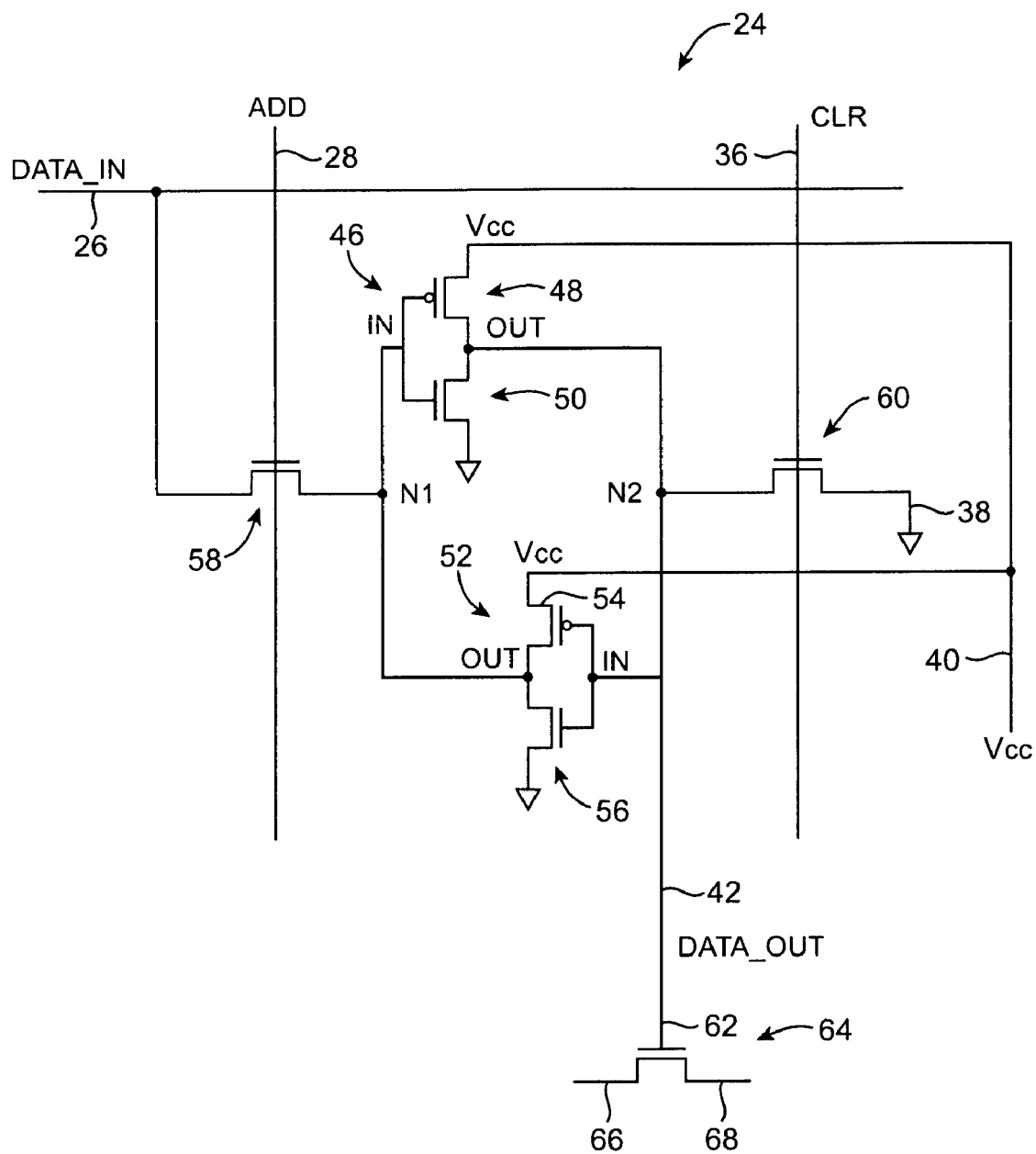
FIG. 3 is a diagram of a conventional programmable logic device memory element.

A conventional memory element 24 of the type used in array 22 of FIG. 2 is shown in FIG. 3. As shown in FIG. 3, the memory element 24 is formed from two cross-coupled inverters—inverter 46 and inverter 52. Inverter 46 has a p-channel metal-oxide-semiconductor (PMOS) transistor 48 and an n-channel metal-oxide-semiconductor (NMOS) transistor 50. Inverter 52 has PMOS transistor 54 and NMOS transistor 56. The NMOS transistor 60 is turned on during clear operations by activating clear line 36. This connects node N2 to ground 38 and clears the memory element 24. The output of the memory element on line 42 (DATA_OUT) is determined by the signal on node N2.

When address line 28 is taken high, NMOS transistor 58 is turned on and the signal on data line 26 is driven into the memory element 46. If the signal on line 26 is high, node N1 remains high and the memory element 24 remains in its low (cleared) state. The output DATA_OUT is low. If the signal on line 26 is low, node N1 is taken low and, due to the inversion of the low N1 signal by inverter 46, the voltage on node N2 is taken high. This makes the output DATA_OUT high.

The DATA_OUT signal is applied to the gate 62 of pass transistor 64. When DATA_OUT is low, pass transistor 64 is off. When DATA_OUT is high, pass transistor 64 is on and data is allowed to flow between line 66 and line 68.

Figure 4:
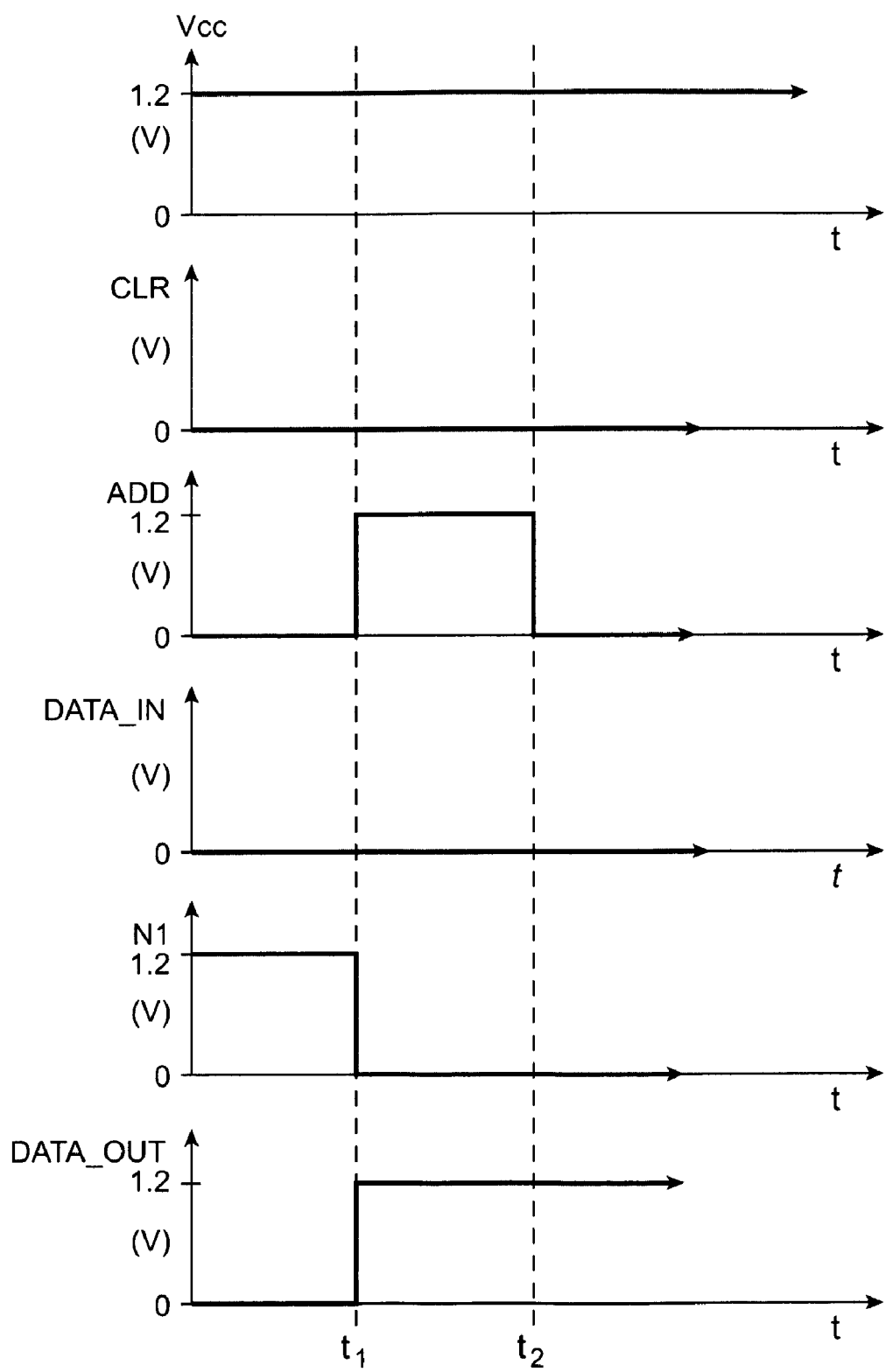
FIG. 4 is a timing diagram showing how a conventional programmable logic device memory cell is loaded with a configuration data bit having a logic one value.
Figure 5:
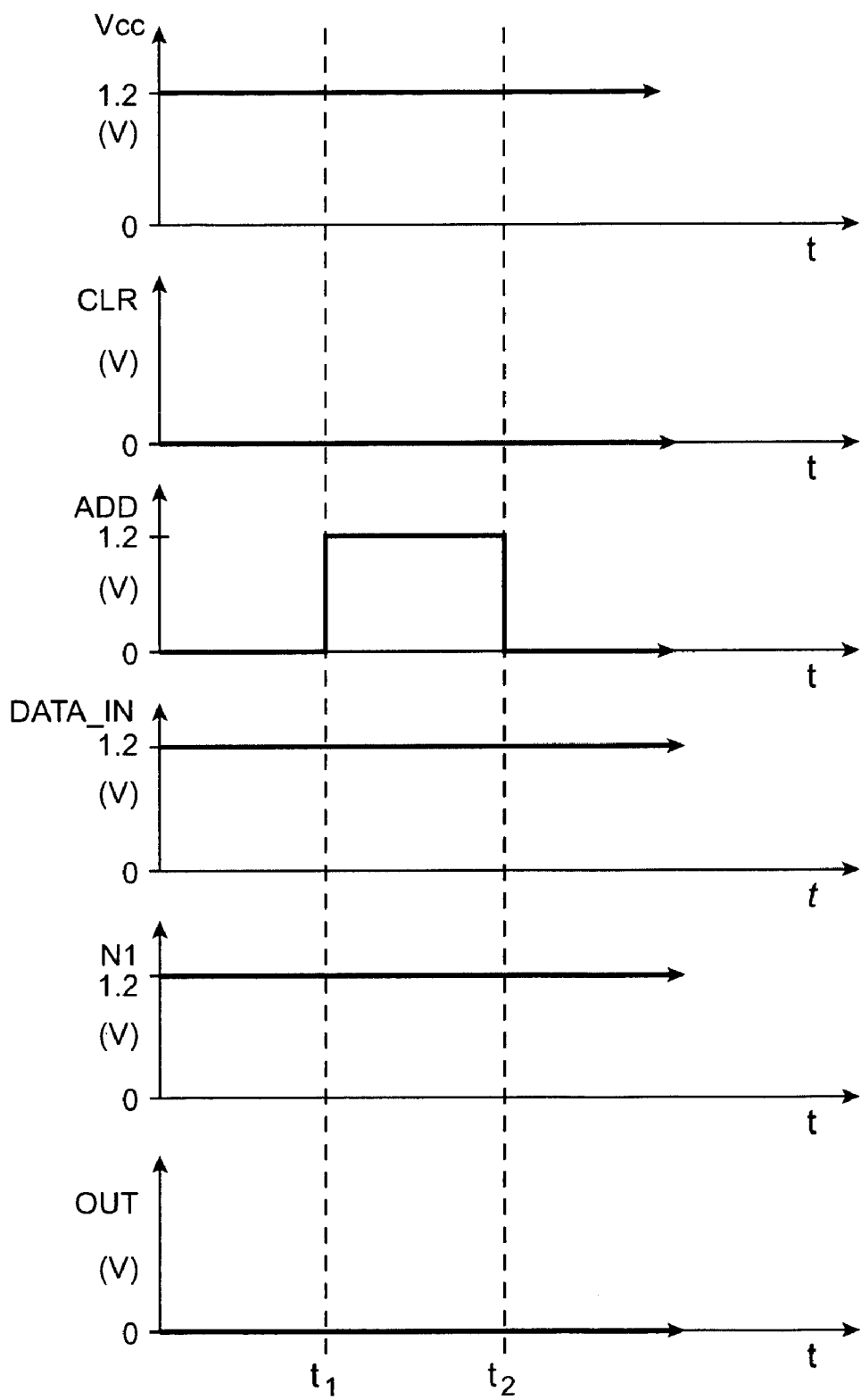
FIG. 5 is a timing diagram showing how a conventional programmable logic device memory cell is loaded with a configuration data bit having a logic zero value.

Signal timing diagrams showing operations associated with loading the conventional memory element 24 are shown in FIGS. 4 and 5. The traces of FIG. 4 illustrate the process of loading a logic "1", into a cleared memory element 24. The traces of FIG. 5 illustrate the process of loading a logic "0" into a cleared memory element 24.

The first trace of FIG. 4 shows that the voltage Vcc applied to Vcc line 40 is constant at 1.2 volts. This positive power supply voltage is applied to inverters 46 and 52.

The second trace of FIG. 4 shows that after clearing operations have been performed during system startup, the clear signal CLR on line 36 is constant at 0 volts.

As shown in the third trace of FIG. 4, the address line ADD is asserted at time $t_1$ and is deasserted at time $t_2$.

The fourth trace of FIG. 4 shows that the value of DATA_IN on line 26 is a constant low signal during data loading operations.

The signal N1 in the fifth trace of FIG. 4 represents the voltage at node N1 in FIG. 3.

The signal DATA_OUT in the sixth trace of FIG. 4 is the same as the voltage at node N2 and represents the contents of the memory element 24. When the memory element is storing a logic one, node N2 is high and DATA_OUT is high. When the memory element is storing a logic zero, node N2 is low and DATA_OUT is low.

As shown in FIG. 4, at times t before $t_1$, ADD is low, so transistor 58 is off. The voltage at node N1 is high and the voltage at node N2 is low. The output DATA_OUT is low. In this situation, the data stored in the memory element is a logic zero, because the memory element is in its cleared state. At time $t_1$, ADD goes high, which turns on transistor 58 and connects the DATA_IN line, which is at 0 volts, to node N1, taking N1 low. The low voltage on node N1 is inverted by inverter 46, so that the voltage on node N2 goes high. The sixth trace of FIG. 4 shows that this makes DATA_OUT go high at $t_1$. At this stage, a logic one is stored in the memory element 24. When the address line ADD is deasserted at time $t_2$, transistor 58 is turned off, which isolates the memory element and prevents further state changes. The DATA_OUT signal remains high at time $t_2$, as shown in the sixth trace of FIG. 4.

The traces of FIG. 5 illustrate the process of loading a logic "0" into a memory element 24 (FIG. 3) that has been cleared. In this situation, the memory element contains a logic zero, so the loading process does not change its state.

The first trace of FIG. 5 shows that the voltage Vcc applied to Vcc line 40 (FIG. 3) is constant at 1.2 volts. The positive power supply voltage Vcc is applied to inverters 46 and 52.

After clearing operations have been performed during system startup, the clear signal CLR on line 36 is constant at 0 volts, as shown by the second trace of FIG. 5.

As shown in the third trace of FIG. 5, the address line ADD is asserted at time $t_1$ and is deasserted at time $t_2$.

The fourth trace of FIG. 5 shows that the value of DATA_IN on line 26 is a constant high value during data loading operations. In the scenario of FIG. 5, a logic zero is being loaded into the memory element 24, so DATA_IN is high. In the scenario of FIG. 4, a logic one was being loaded into the memory element 24, so DATA_IN was low.

The signal N1 in the fifth trace of FIG. 5 represents the voltage at node N1 in FIG. 3. N1 does not change when a zero is being loaded into a memory element that has already been cleared.

The signal DATA_OUT in the sixth trace of FIG. 5, which is the same as the voltage at node N2, represents the contents of the memory element 24. Because the memory element 24 is cleared, DATA_OUT is low prior to time $t_1$. After time $t_1$, ADD is asserted, which turns transistor 58 on and connects the high DATA_IN signal to node N1. N1 is already high, so applying the high DATA_IN signal to node N1 does not cause the state of the memory element 24 to change at time $t_1$, as shown in the DATA_OUT trace of FIG. 5. The DATA_OUT signal also remains fixed at its low value after the ADD line is deasserted at time $t_2$.

In conventional memory elements such as the conventional memory element 24 of FIG. 3, the address, clear, and data signals range from a logic low value of 0 volts to a logic high value of Vcc.

In accordance with the present invention, different values for these signals may be used to improve performance. For example, the address signals may be elevated during data write operations of the type described in connection with FIGS. 4 and 5 and may be lowered during data read operations. Moreover, the memory element power supply level may be elevated.

Figure 6:
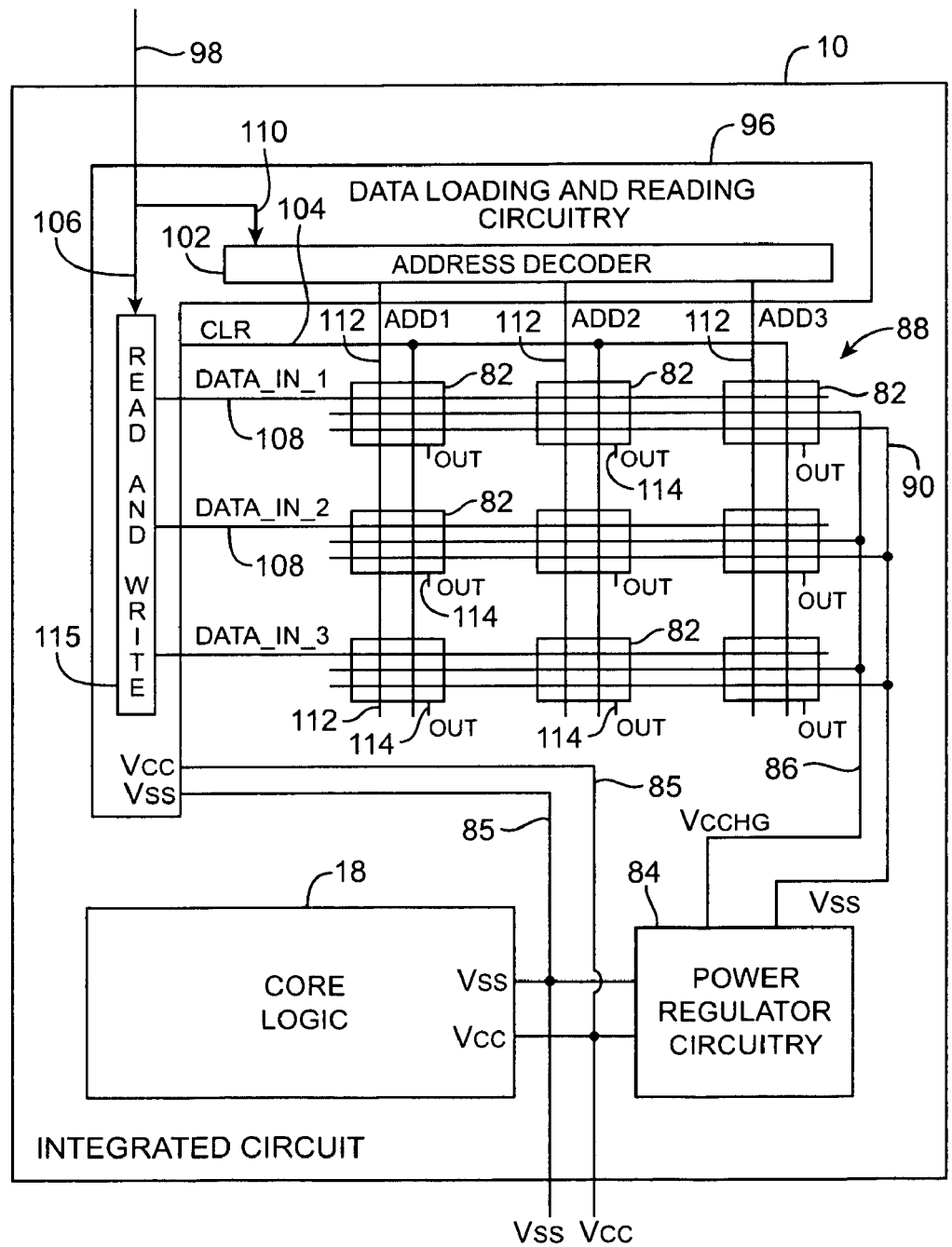
FIG. 6 is a diagram of an illustrative programmable logic device with memory element circuitry in accordance with the present invention.

As shown in FIG. 6, a programmable logic device integrated circuit 10 in accordance with the present invention contains data loading and reading circuitry 96. Memory elements 82 are arranged in an array 88. Address lines 112 and data lines 108 are used to address the array. A clear signal CLR on clear line 104 is used to clear the memory elements 82 in preparation for data loading operations. Each memory element 82 produces an output on a corresponding data output line 114.

Programmable logic device 10 contains core logic 18. Core logic 18 contains programmable core logic that is powered at a positive power supply voltage Vcc and a ground voltage Vss. With one illustrative arrangement, the positive power supply voltage Vcc is about 1.2 volts and the ground voltage Vss is 0 volts. Other arrangements may be used. For example, Vcc may be greater than or less than 1.2 volts and Vss may be greater than or less than 0 volts. The use of a Vcc value of 1.2 volts and a Vss value of 0 volts is merely illustrative.

Power supply voltages such as Vcc and Vss may be supplied to circuitry on device 10 using any suitable arrangement. For example, power supply voltages may be received from one or more external power supply pins. Power supply voltages that are greater or less than the externally-supplied power supply voltages can be generated using on-chip circuitry. For example, a voltage divider may be used to reduce an externally-supplied voltage and a charge pump or other voltage boosting circuit may be used to generate a power supply voltage that is greater than an externally-supplied power supply voltage.

In the illustrative arrangement of FIG. 6, power regulator circuitry 84 is supplied with external power supply voltages Vcc and Vss. Power regulator circuitry 84 uses these voltages to generate power supply voltages Vss and Vcchg for the memory elements 82 in array 88.

Data loading and reading circuitry 96 provides address, clear, and data signals to array 88. With one suitable arrangement, data loading and reading circuitry 96 provides at least some of these signals at voltages greater than Vcc. These elevated voltages may be received from any suitable source (e.g., a pin or power regulator circuitry 84.) In the example of FIG. 6, data loading and reading circuitry 96 generates elevated voltages internally from power supply voltages Vss and Vcc, which are received from external pins over lines 85. The power supply voltages Vss and Vcc are also provided to core logic 18.

Core logic 18 contains n-channel and p-channel metal-oxide-semiconductor transistors and programmable logic components formed from n-channel and p-channel metal-oxide-semiconductor transistors such as inverters, multiplexers, logic gates, register logic, look-up tables, etc. In a typical scenario, a circuit or component in programmable core logic 18 has a positive power supply terminal that receives positive power supply voltage Vcc and a ground power supply terminal that receives ground power supply voltage Vss.

Power regulator circuitry 84 supplies ground power supply voltage Vss and positive power supply voltage Vcchg to the memory elements 82 in array 88 using lines 90 and 86. In general, any suitable power supply voltage may be used to power elements 82. When the power supply voltage is elevated (i.e., when the difference between the positive power supply voltage and the ground voltage is larger than Vcc), the performance of the device 10 is enhanced. In particular, using an elevated power supply voltage makes it possible for the output control signals from the memory elements 82 to more fully turn on n-channel transistors in core logic 18 and to more fully turn off p-channel transistors in core logic 18 than would otherwise be possible.

In general, an elevated power supply voltage may be implemented using an increased positive power supply voltage and/or a decreased ground power supply voltage. The introduction of power supply lines with different voltage levels into a programmable logic device architecture tends to add complexity. To avoid adding unnecessary complexity, it is may be desirable to limit the use of different power supply voltages. One suitable approach for limiting the number of power supply levels is to use the same ground voltage Vss to power array 88 that is used to power core logic 18 and data loading and reading circuitry 96. This type of arrangement is described as an example. If desired, however, other arrangements such as those in which the ground voltage for array 88 differs from the ground voltage for core logic 18 may be used.

Lines 86 and 90 are used to distribute Vcchg and Vss to each of the memory elements 82 in memory element array 88. In the example of FIG. 6, there are three rows and three columns of memory elements 82 in array 88. This is merely illustrative. Integrated circuits such as integrated circuit 10 may have any suitable number of memory elements 82. A typical memory array might, as an example, have thousands or millions of memory elements 82 arranged in hundreds or thousands or rows and columns.

The signal Vss is constant. The signal Vcchg may be a constant value Vcchg-high. For example, Vcchg-high may be a constant value such as 1.6 volts. The value of Vcchg-high is greater than Vcc (e.g., 1.2 volts). If desired, power regulator circuitry 84 may generate a time-varying power supply signal to facilitate data loading operations. For example, power regulator circuitry 84 may reduce the value of Vcchg from Vcchg-high to a value of Vcchg-low during data loading operations. Lowering Vcchg during data loading operations helps to improve the write margin for memory elements 82 and/or reduces the real estate requirements for the address transistors used in loading the memory elements. The use of a time-varying Vcchg in array 88 is described herein as an example.

Using a relatively low power supply level Vcc to power the core logic 18 provides benefits such as reduced power consumption. The power supply level used to power the memory elements 82 is larger than the core power supply level, because Vcchg-high—Vss is greater than Vcc—Vss. However, any loss in power consumption efficiency in array 88 that results from using an elevated power supply level in array 88 is offset by performance benefits.

Data loading and reading circuitry 96 controls clearing and data loading operations for array 88. Data loading and reading circuitry 96 receives configuration data from external sources via input path 98. In a typical system, configuration data is loaded into a programmable logic device from a memory and data loading circuit. This type of circuit, which is sometimes referred to as a configuration device, loads configuration data into registers within read and write circuitry 115. Address decoder 102 may receive external control signals via path 98 and input 110 or addressing control signals can be generated internally in data loading and reading circuitry 96.

Data loading and reading circuitry 96 produces clear signals on clear line 104 (labeled CLR). Asserting the signal CLR with circuitry 96 clears the contents of the memory array 88. Clearing operations are generally performed upon system power-up or during reconfiguration. After the array has been cleared, the CLR signal is deasserted and the configuration data is loaded.

To support data loading operations, configuration data may be loaded into registers in read and write circuitry 115 via paths 98 and 106. The registers apply the configuration data in parallel to array 88 via the DATA_IN_1, DATA_IN_2, and DATA_IN_3 lines 108. Address decoder 102 receives addressing information via input 110 from an external source or from circuitry in data loading and reading circuitry 96. The address decoder 102 systematically asserts and deasserts desired address lines 112 (i.e., ADD1, ADD2, or ADD3). As the address line in each column is asserted, the data on the data lines 108 is loaded into the memory elements 82 in that column. By addressing each column in this way, the entire array 88 is loaded with configuration data.

After the array has been loaded, proper data loading can be confirmed using the read circuitry of read and write circuitry 115 to read out the data that has been programmed into memory elements 82. This operation, which is sometimes referred to as data confirmation or data reading, is used to ensure that no errors have occurred during the loading process. If the values of the confirmation data read out from array 88 do not match the values that were used during data loading, an error message may be generated, the loading process can be repeated, or other suitable corrective actions may be taken.

During data read operations, the data lines 108 are used as read lines. In particular, the DATA_IN_1, DATA_IN_2, and DATA_IN_3 lines 108 are used to convey loaded configuration data values from a column of addressed memory elements 82 to the read and write circuitry 115.

After successful confirmation of the data loading process is complete, the loaded configuration data is used to control the operation of the programmable logic on device 10, so that the device 10 can be used in a system. During normal operation, the output 114 of each memory element 82 produces a corresponding static control signal for controlling the gate of an NMOS transistor such as an NMOS pass transistor, a PMOS transistor such as a PMOS power-down transistor, or other circuit component in the programmable core logic 18 of the programmable logic device 10.

Figure 7:
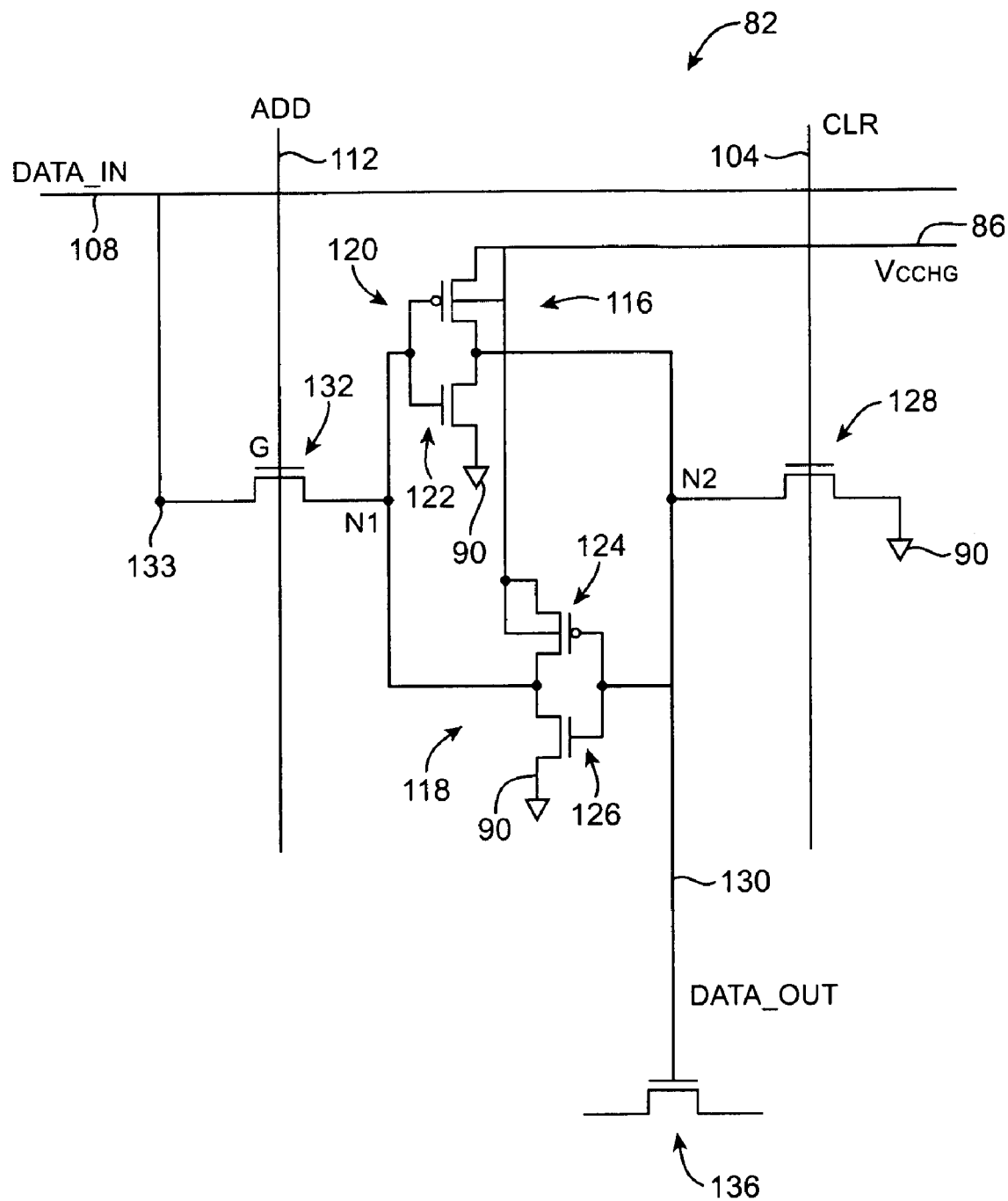
FIG. 7 is a diagram of an illustrative memory element for an integrated circuit such as a programmable logic device integrated circuit of the type shown in FIG. 6 in accordance with the present invention.

An illustrative memory element 82 is shown in FIG. 7. During programming, memory element 82 receives data on DATA_IN line 108. After data has been loaded into the array, a data confirmation operation is performed to determine whether the data has been loaded properly. During data confirmation operations, the DATA_IN line serves as a verification pathway. When loading, data flows from data loading and reading circuitry 96 of FIG. 6 into the array 88 along lines 108. When performing data confirmation operations, data flows from the array 88 into the data loading and reading circuitry 96 of FIG. 6 in the opposite direction along lines 108.

During both loading and reading operations, address signals ADD are systematically asserted on address lines 112. This allows the data loading and reading circuitry 96 (FIG. 6) to address the columns of the array 88 for data writing or reading.

The memory element 82 of FIG. 7 has two cross-coupled inverters. Inverter 116 has transistors 120 and 122. Inverter 118 has transistors 124 and 126. Transistors 120 and 124 are p-channel metal-oxide-semiconductor transistors. Transistors 122 and 126 are n-channel metal-oxide-semiconductor transistors. The voltages on nodes N1 and N2 have opposite polarity. When N1 is low, N2 is high and the memory element 82 is said to be programmed. The content of a programmed memory element in this situation is a logic one. When N1 is high and N2 is low, the memory element contains a logic zero and is said to be cleared.

As shown in FIG. 7, the voltage on node N2 is the same as the DATA_OUT voltage. The DATA_OUT signal is applied to programmable core logic components such as transistor 136 over lines such as line 130 (shown as outputs 114 in FIG. 6).

In accordance with the present invention, the voltage of the address signal ADD on line 112 has a relatively high voltage during writing operations and has a relatively low voltage during data confirmation (reading) operations. The ADD signal is generated by address decoder 102 of data loading and reading circuitry 96 (FIG. 6). With one suitable arrangement, the address signals range from a low value of Vss to a high value of Vcchg-high during data loading and range from a low value of Vss to a high value of Vcchg-low (e.g., Vcc) during data reading operations (data confirmation).

The elevated address voltage used during writing operations (1.6 volts in this example) turns on address transistor 132 more than would otherwise be possible, which reduces the real estate requirements for address transistor 132 and/or increases the write margin for memory element 82. The lowered address voltage used during data confirmation read operations (1.2 volts in this example) increases the read margin of the memory element 82.

Figure 8:
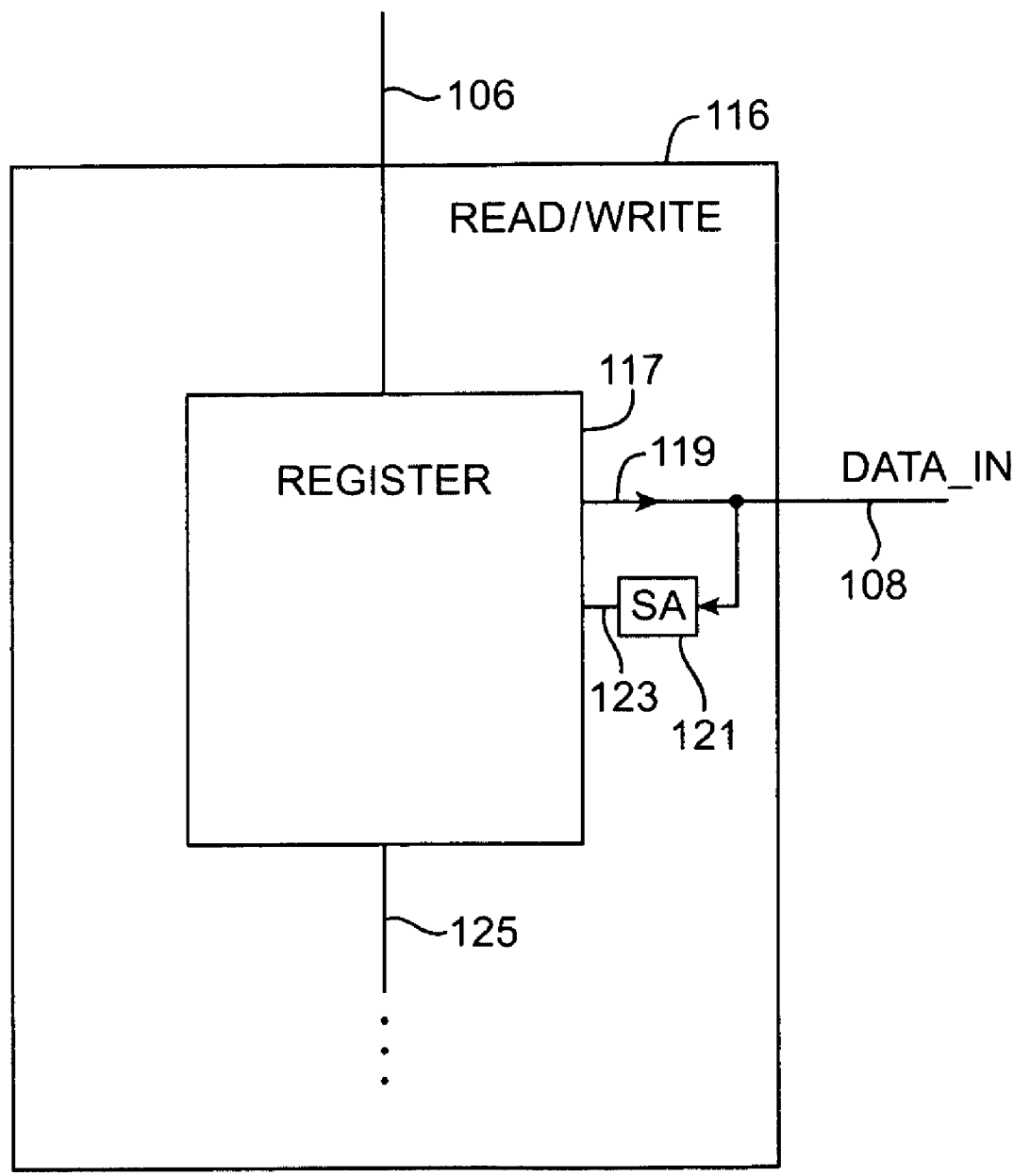
FIG. 8 is a circuit diagram of illustrative read and write circuitry in accordance with the present invention.

Illustrative read and write circuitry 115 that may be used in the data loading and reading circuitry 96 of FIG. 6 is shown in FIG. 8. As shown in FIG. 8, read and write circuitry 115 contains registers 117, which are connected in a chain using paths such as path 125. During data loading operations, the outputs 119 of registers 117 are enabled and sense amplifiers 121 are disabled. After data has been shifted into registers 117, each register provides a configuration data output signal on a corresponding output 119. Outputs 119 are each connected to a respective DATA_IN line 108 for loading the configuration data into the memory elements 82 of array 88 (FIG. 6). To confirm that the configuration data has been properly loaded, data read operations are performed using DATA_IN lines 108. During data read operations, register outputs 119 are disabled and sense amplifiers 121 are enabled. In this configuration, data flows from an addressed column of the array 88 into registers 117 via DATA_IN lines 108, sense amplifiers 121, and inputs 123.

Figure 9:
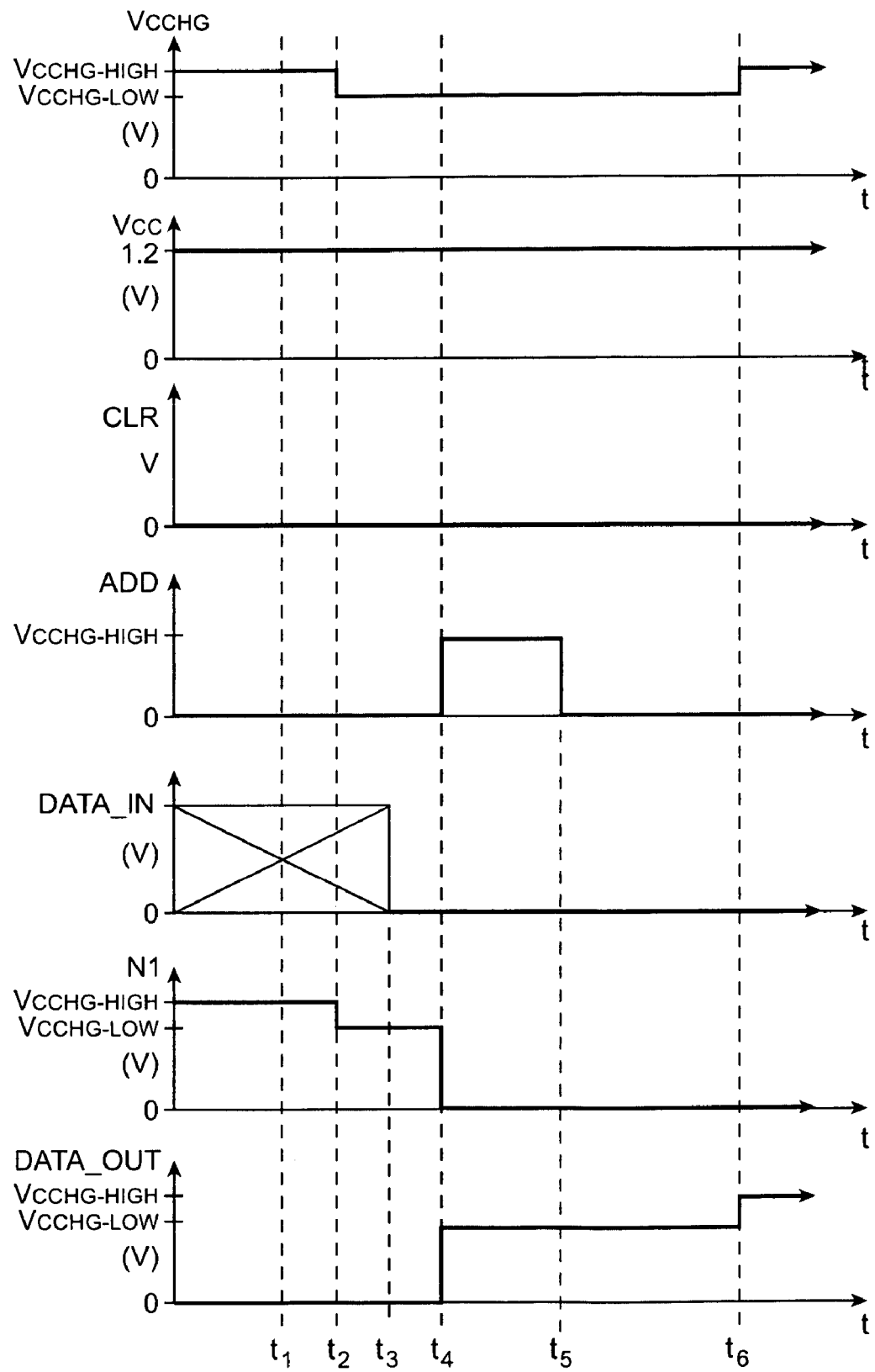
FIG. 9 is a timing diagram showing how a programmable logic device memory element of the type shown in FIG. 7 is loaded with a configuration data bit having a logic one value in accordance with the present invention.
Figure 10:
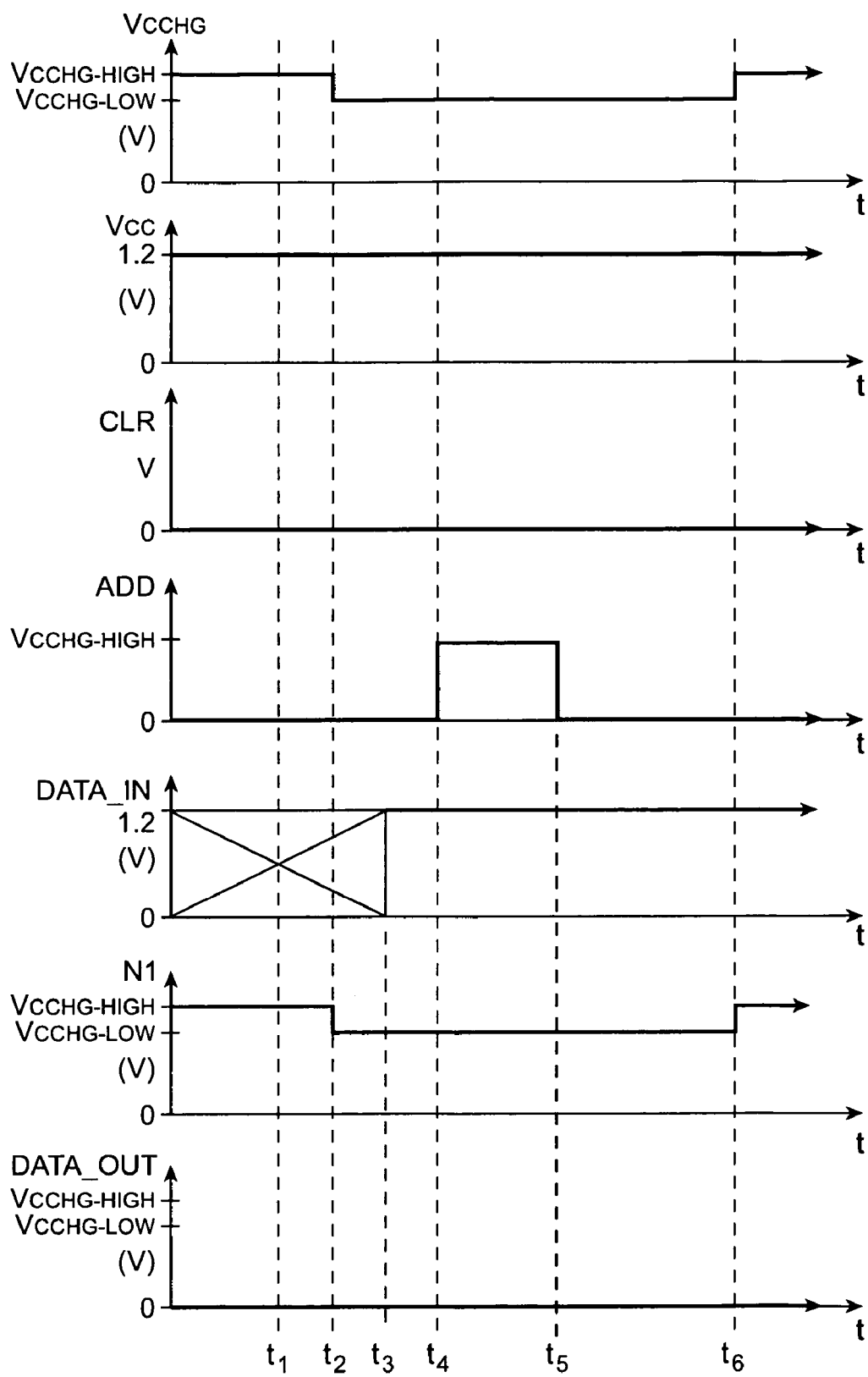
FIG. 10 is a timing diagram showing how a programmable logic device memory element of the type shown in FIG. 7 is loaded with a configuration data bit having a logic zero value in accordance with the present invention.

FIGS. 9 and 10 show illustrative voltages that may be used during a write operation. In the example of FIGS. 9 and 10, the positive power supply voltage Vcchg for the memory elements 82 in the array is lowered from a high value of Vcchg-high (e.g., 1.6 volts) to a low value of Vcchg-low (e.g., 1.2 volts) during the period in which the address signals are being asserted. This helps to improve the performance of memory element 82. FIG. 9 shows signals involved in writing a logic one into a memory element. FIG. 10 shows signals involved in writing a logic zero into a memory element.

Successful data write operations require that address transistor 132 be stronger than transistor 124 and inverter 118, so that data from line 108 can be driven into the memory element 82. When Vcchg is lowered, the strength of transistor 124 is weakened. As a result, it is not necessary for address transistor 132 to be as strong as would otherwise be required. Lowering Vcchg therefore increases the write margin for memory element 82 and/or reduces the real estate requirements for address transistor 132. Depending on design considerations, a lowered Vcchg value may be used to allow a designer to reduce the real estate consumed by each address transistor 132 (e.g., by reducing its gate width), may be used to increase write margin (by using the improved strength of the address transistor 132 to help ensure that no errors occur during writing), or may be used both to reduce real estate and increase write margin.

When the address signal ADD is asserted, its voltage increases from 0 volts (Vss) to an elevated level. In the example of FIGS. 9 and 10, the elevated level is Vcchg-high (e.g., 1.6 volts). Use of an elevated address signal during write operations increases the magnitude of the voltage that is applied to the gate G of address transistor 132 during writing. In the present example, the voltage that is applied to the gates of the address transistors 132 that are being addressed during write operations is Vcchg-high (1.6 volts). Use of an elevated value of Vcchg-high to control transistor 132 turns on transistor 132 more than use of a lower conventional voltage of Vcc. The elevated address signal value of Vcchg-high therefore serves to effectively increase the strength of transistor 132 for a given size (gate width).

The increase in the effective strength of address transistor 132 that is achieved using the elevated address signal level helps to further increases the write margin of memory element 82 and/or reduce the real estate requirements for transistor 132.

In FIG. 9, the memory element 82 is initially cleared and is being loaded with a logic one. When the address signal ADD is asserted, the signal on the DATA_OUT line therefore rises from low to high, as shown in the lowermost trace of FIG. 9.

After the entire array 88 has been loaded with data in this way, the voltage Vcchg may be raised to its high level of Vcchg-high (e.g. 1.6 volts). This causes the outputs of the memory elements 82 that contain logic ones to be provided to the programmable core logic at a voltage that is greater than the programmable core logic positive power supply voltage of Vcc (e.g., 1.2 volts), thereby improving performance.

The first trace of FIG. 9 shows that the power supply voltage Vcchg that is applied to line 86 by power regulator circuitry 84 (FIG. 6) to power the memory elements 82 in array 88 varies between an elevated value of Vcchg-high and a reduced value of Vcchg-low. Vcchg-low may, as an example, be equal to Vcc. The positive power supply voltage Vcchg is applied to inverters 116 and 118. The value of Vcchg is high at time $t_1$ (in this example). When it is desired to load a configuration data bit into memory element 82, power regulator circuitry 84 reduces the value of Vcchg from Vcchg-high to Vcchg-low (time $t_2$). After all of the columns of array 88 have been loaded with configuration data, the power regulator circuitry 84 raises the value of Vcchg to Vcchg-high (at time $t_6$). At times after $t_6$, the integrated circuit 10 is operating normally and each memory element 82 is producing a static output signal at a value of Vss (when a logic 0 has been stored) or at Vcchg-high (when a logic 1 has been stored).

As shown in the second trace of FIG. 9, the value of Vcc in this example remains constant at 1.2 volts. The power supply voltage Vcc may, for example, be used to power circuitry such as programmable core logic 18 and data loading and reading circuitry 96 (FIG. 6). If desired, other power supply voltages may be used on programmable logic device 10. For example, a higher voltage Vccio may be used to power input-output circuitry 12 (FIG. 1). To avoid unnecessary complexity, the circuitry that supplies voltages such as Vccio may be used to provide other elevated voltages. For example, Vcchg-high and Vccio may be provided by or derived from same voltage source.

As shown by the third trace of FIG. 9, after clearing operations have been performed during system startup, the clear signal CLR on line 104 is constant at 0 volts.

The fourth trace of FIG. 9 shows how the address line ADD is asserted at time $t_4$ and is deasserted at time $t_5$. In accordance with the present invention, the address signal varies from a low value of Vss to an elevated value. In the example of FIG. 9, the elevated address signal has a magnitude of Vcchg-high.

The fifth trace of FIG. 9 shows that the value of DATA_IN on line 108 is not defined at times t before $t_3$. At time $t_3$, data loading circuitry 96 produces a low DATA_IN signal (in the FIG. 9 example).

When the address line ADD is taken high at $t_4$, transistor 132 (FIG. 7) is turned on, which connects the low DATA_IN line 108 to node N1. The elevated value of ADD helps to strongly turn on address transistor 132 at time $t_4$.

The voltage on node N1 is shown in the sixth trace of FIG. 9. At time $t_1$, inverters 116 and 118 are powered at Vcchg-high (in this example) and the voltage on node N1 is Vcchg-high. At time $t_2$, the voltage Vcchg drops from Vcchg-high to Vcchg-low (trace 1). This drop in Vcchg is reflected in the voltage on node N1, which also drops from Vcchg-high to Vcchg-low. At time $t_4$, when transistor 132 is turned on by the elevated ADD signal and the low DATA_IN line is connected to node N1, the voltage on node N1 is taken low.

The low voltage on node N1 is inverted by inverter 116, so that the voltage on node N2 and the output voltage on line 130 (DATA_OUT) go high at time $t_4$. This completes programming of a single column of memory elements, so ADD is deasserted at time t5.

The level of Vcchg generally remains low as each column of memory elements is loaded. After all desired columns of memory elements 82 have been loaded with configuration data, the power regulator circuitry 84 raises Vcchg from Vcchg-low to Vcchg-high (time $t_6$).

With the power supply voltage Vcchg-high applied to inverters 116 and 118, the DATA_OUT signal on line 130 is at a voltage level of Vcchg-high. The DATA_OUT signal is elevated (Vcchg-high is at 1.6 volts compared to 1.2 volts for Vcc and Vcchg-low in this example), so the static high output signals that are applied to the components of programmable core logic 18 of FIG. 6 such as transistor 136 (FIG. 7) are sufficiently high to control these components satisfactorily (e.g., with low on resistances for n-channel devices and low leakage currents for p-channel devices).

The lowered value of Vcchg (Vcchg-low) and the elevated value of ADD (Vcchg-high) that are used when the address signal ADD is asserted at time $t_4$ relax the requirements on the relative strengths of NMOS transistor 132 and PMOS transistor 124. If ADD had not been elevated (and if Vcchg had not been lowered), a larger NMOS transistor 132 and larger accompanying signal lines would have been required to ensure that PMOS transistor 124 could be overcome and to ensure that the IR drops associated with the data loading operation would not be excessive. When the address signal is elevated and when the power supply level is lowered during data loading, the strength requirements and real estate requirements for NMOS transistor 132 are reduced.

The traces of FIG. 10 illustrate the process of loading a logic 0 into a memory element 82 (FIG. 7) that has been cleared. In this situation, the memory element 82 contains a logic zero, so the loading process does not change its state.

The first trace of FIG. 10 shows that the power supply voltage Vcchg that is applied to line 86 by power regulator circuitry 84 (FIG. 7) varies between an elevated value of Vcchg-high and a reduced value of Vcchg-low, as described in connection with FIG. 9. The value of Vcchg is high at time $t_1$. At time $t_2$, power regulator circuitry 84 reduces the value of Vcchg from Vcchg-high to Vcchg-low in preparation for configuration data loading. The time-varying power supply voltage Vcchg may remain low until array 88 (FIG. 6) has been completely loaded. After array 88 has been loaded with configuration data, the power regulator circuitry 84 raises the value of Vcchg to Vcchg-high (time $t_6$).

As shown in the second trace of FIG. 10, the value of Vcc remains constant at 1.2 volts (in this example).

As shown by the third trace of FIG. 10, after clearing operations have been performed during system startup, the clear signal CLR on line 104 is constant at 0 volts.

The fourth trace of FIG. 10 shows how the address line ADD is asserted at time $t_4$ and is deasserted at time $t_5$. The value of the address signal ranges from a low value of 0 volts (Vss) to a high value of Vcchg-high. Using this elevated voltage helps to strongly turn on address transistor 132 and thereby reduces the real estate requirements for address transistor 132 and/or increases the write margin for the memory element.

The fifth trace of FIG. 10 shows that the value of DATA_IN on line 108 is not defined at times t before $t_3$. At time $t_3$, data loading circuitry 96 produces a high DATA_IN signal.

When the address line ADD is asserted at time $t_4$, the address signal rises to its high value of Vcchg. This turns on transistor 132 (FIG. 7) and connects the high DATA_IN line 108 to node N1. The voltage on node N1 is shown in the sixth trace of FIG. 10. At time $t_3$, the memory element 32 is in its cleared state. In this state, the voltage on node N2 is at ground. The inverters 116 and 118 are powered at a voltage of Vcchg-low at time $t_3$, so the inverted N2 voltage at node N1 is Vcchg-low. At time $t_4$, when the address line is taken to Vcchg-high, transistor 132 is turned on and the high DATA_IN line is connected to node N1. Node N1 is already high, so as shown in the seventh trace of FIG. 10, the state of the data output line DATA_OUT remains low and does not change its state at time $t_4$.

Data loading of the logic 0 bit into the memory element 82 is completed by deasserting the address line ADD at time $t_5$. After all columns of array 88 have been loaded with configuration data in this way, the power regulator circuitry 84 raises Vcchg from Vcchg-low to Vcchg-high at time $t_6$.

Before the device 10 is used in the field, it is generally desirable to verify that the configuration data has been loaded into the array properly. To confirm that data has been loaded properly, data is read out from the array over lines 108. If the data that is read out in this way is the same as the data that was loaded, the device has been programmed properly and may be used in a system. If the data that is read out differs from the intended configuration data, an error has occurred.

Figure 11:
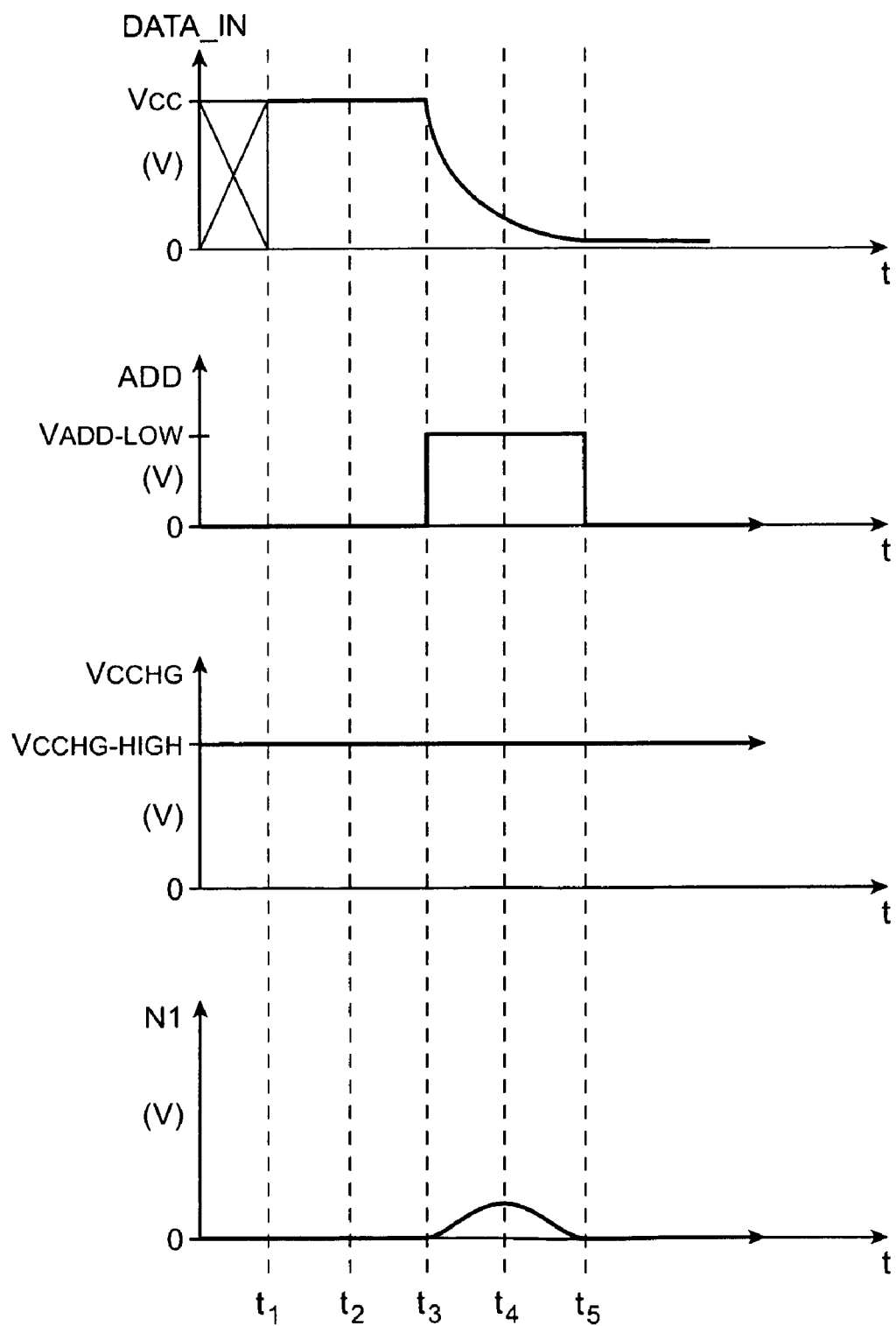
FIG. 11 is a timing diagram showing how a programmable logic device memory element of the type shown in FIG. 7 is read to confirm proper loading of a configuration data bit having a logic one value in accordance with the present invention.
Figure 12:
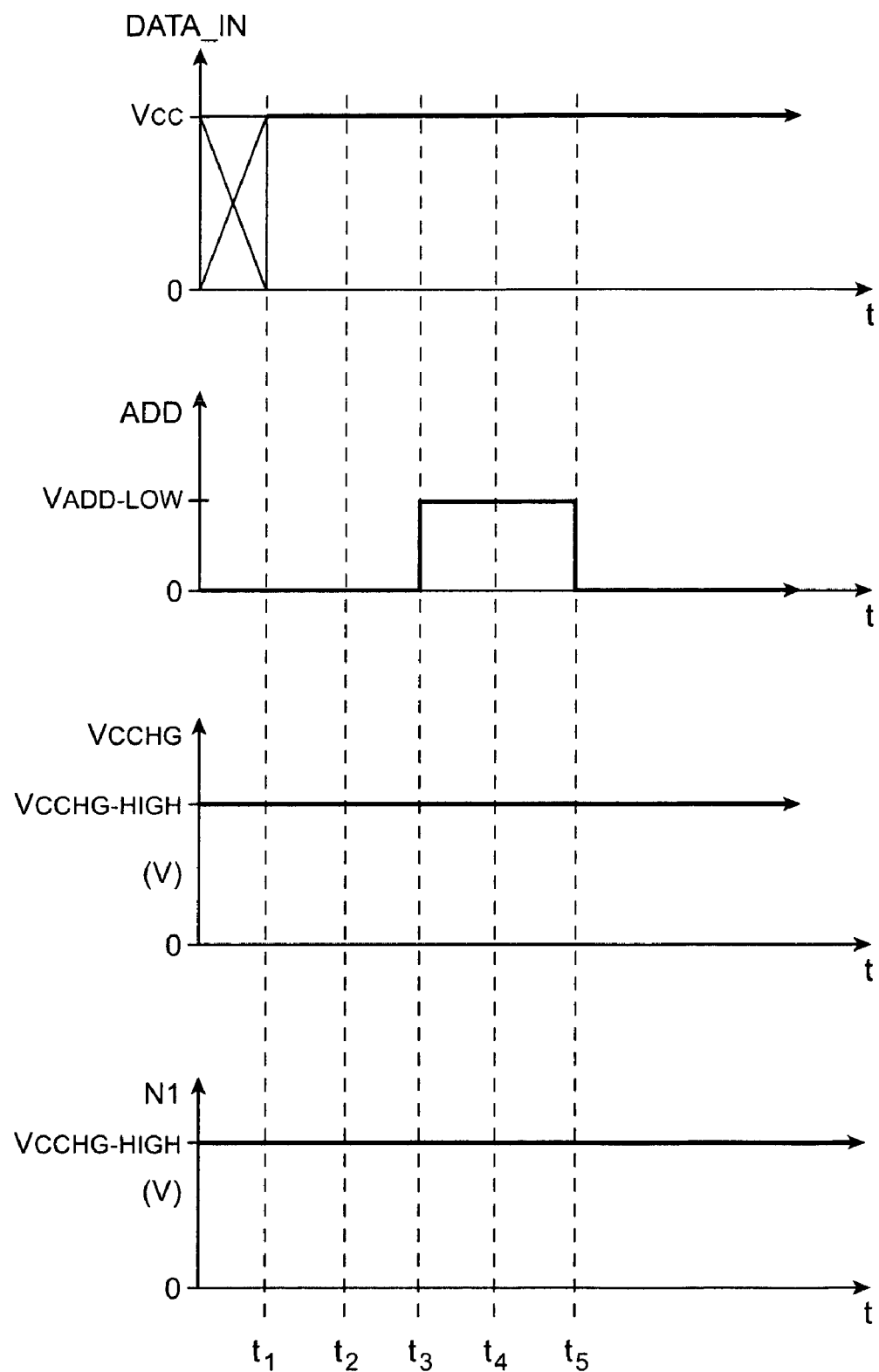
FIG. 12 is a timing diagram showing how a programmable logic device memory element of the type shown in FIG. 7 is read to confirm proper loading of a configuration data bit having a logic zero value in accordance with the present invention.

Data read operations that may be performed when confirming that configuration data has been properly loaded are shown in FIGS. 11 and 12. FIG. 11 shows operations involved in reading a logic one. FIG. 12 shows operations involved in reading a logic zero.

During read operations, the address signal ADD is systematically taken high to address the columns of array 88. The address signal ADD used during read operations is preferably relatively low (i.e., ADD is smaller during read operations than during write operations) to improve the read margin of the memory elements.

In FIG. 11, the memory element contains a logic one (i.e., N1 is 0 and the memory element is considered to be programmed).

As shown in the first (uppermost) trace in FIG. 11, the voltage of signal DATA_IN is initially at a high voltage of Vcc (e.g., 1.2 volts) in preparation for data read operations. At times before $t_1$, the DATA_IN signal is not valid. At time $t_1$, the data loading and reading circuitry 96 of FIG. 6 strongly takes DATA_IN high. At time $t_2$, the data loading and reading circuitry 96 weakly holds DATA_IN high. At time $t_3$, the address signal ADD is asserted by taking ADD from 0 volts to Vadd-low, as shown in the second trace of FIG. 11. The value of Vadd-low may be, as an example, a voltage of 1.2 volts (Vcc). During data read operations, the memory element 82 may be powered using an elevated positive power supply voltage of Vcchg-high (e.g., 1.6 volts), as shown in the third trace of FIG. 11.

Taking ADD high at time $t_3$ turns on transistor 132 (FIG. 7). At times between $t_3$ and $t_5$, transistor 132 remains on, so the weakly held high voltage on the DATA_IN line 108 is exposed to the output of inverter 118. Node N2 is high, so transistor 126 is on and the output of inverter 118 drives a low voltage onto node N1. Transistor 126 (FIG. 7) is stronger than the weakly held "1" on the DATA_IN line 108, so the value of the DATA_IN signal falls to about 0 volts, as shown in the first trace of FIG. 11. At time $t_4$, the data loading and reading circuitry 96 (FIG. 1) detects the low voltage of the DATA_IN signal and can therefore conclude that the voltage on N1 was low and that the memory element contained a logic one (in this example).

As shown in the fourth trace of FIG. 11, the voltage on node N1 momentarily increases when address transistor 132 is turned on by the ADD signal at time $t_3$. The rise in N1 that is shown in the fourth trace of FIG. 11 is not desirable. If this rise were to become too large, the inverter 116 would drive a "0" onto node N2 and the state of the memory element 82 would flip. Because the voltage of the ADD signal (i.e., the signal Vadd-low of 1.2 volts in this example) is relatively low, the transistor 132 is not turned on too strongly. As a result, the peak of the undesired rise in the voltage N1 is well controlled and no flip occurs.

In FIG. 12, the memory element contains a logic zero (i.e., N1 is high, N2 is low, and the memory element is considered to be cleared).

At times before $t_1$, the DATA_IN signal is not valid, as shown in the first (uppermost) trace in FIG. 12. At time $t_1$, the data loading and reading circuitry 96 of FIG. 6 strongly takes DATA_IN high. At time $t_2$, the data loading and reading circuitry 96 weakly holds DATA_IN high. At time $t_3$, the address signal ADD is asserted by taking ADD from 0 volts to Vadd-low (e.g., Vcc), as shown in the second trace of FIG. 12. As shown in the third trace of FIG. 12, the memory element 82 may be powered using an elevated positive power supply voltage of Vcchg-high (e.g., 1.6 volts). Taking ADD high at time $t_3$ turns on transistor 132 (FIG. 7).

When n-channel metal-oxide-semiconductor address transistor 132 is turned on at times between $t_3$ and $t_5$, signals are allowed to flow from node N1 to node 133 (FIG. 7). Because Vcchg is elevated at Vcchg-high, the voltage of node N1 at time $t_3$ is Vcchg-high, which is higher than the weakly held voltage Vcc on the DATA_IN line 108. The gate G of address transistor 132 is maintained at an address signal voltage of Vadd-low (Vcc). Because of the characteristics of metal-oxide-semiconductor transistors such as transistor 132, when the voltage at nodes N1 and 133 is higher than the voltage at address line 112 (gate G) minus the threshold voltage Vt of NMOS transistor 132, transistor 132 is off and isolates nodes N1 and 133. The voltage level of the weakly held DATA_IN line 108 at times before $t_3$ therefore remains unchanged at time $t_3$, so that no change takes place in the voltage of node N1 at time $t_3$. At time $t_4$, the data loading and reading circuitry 96 (FIG. 6) detects the high voltage of the DATA_IN signal and concludes that the voltage on N1 was high and that the memory element contained a logic zero The address signal is deasserted at time $t_5$, as shown in the second trace of FIG. 12.

As shown in the fourth trace of FIG. 12, the voltage on node N1 remains constant at Vcchg-high during times t3 to t5, even though the address signal is high. This is because the gate voltage G is capped at a relatively low address signal voltage of Vadd-low (Vcc). The upper limit imposed on the gate voltage G limits the maximum voltage that is driven onto output node 133 by inverter 118, so the voltage N1 is well controlled during the read operation.

Figure 13:
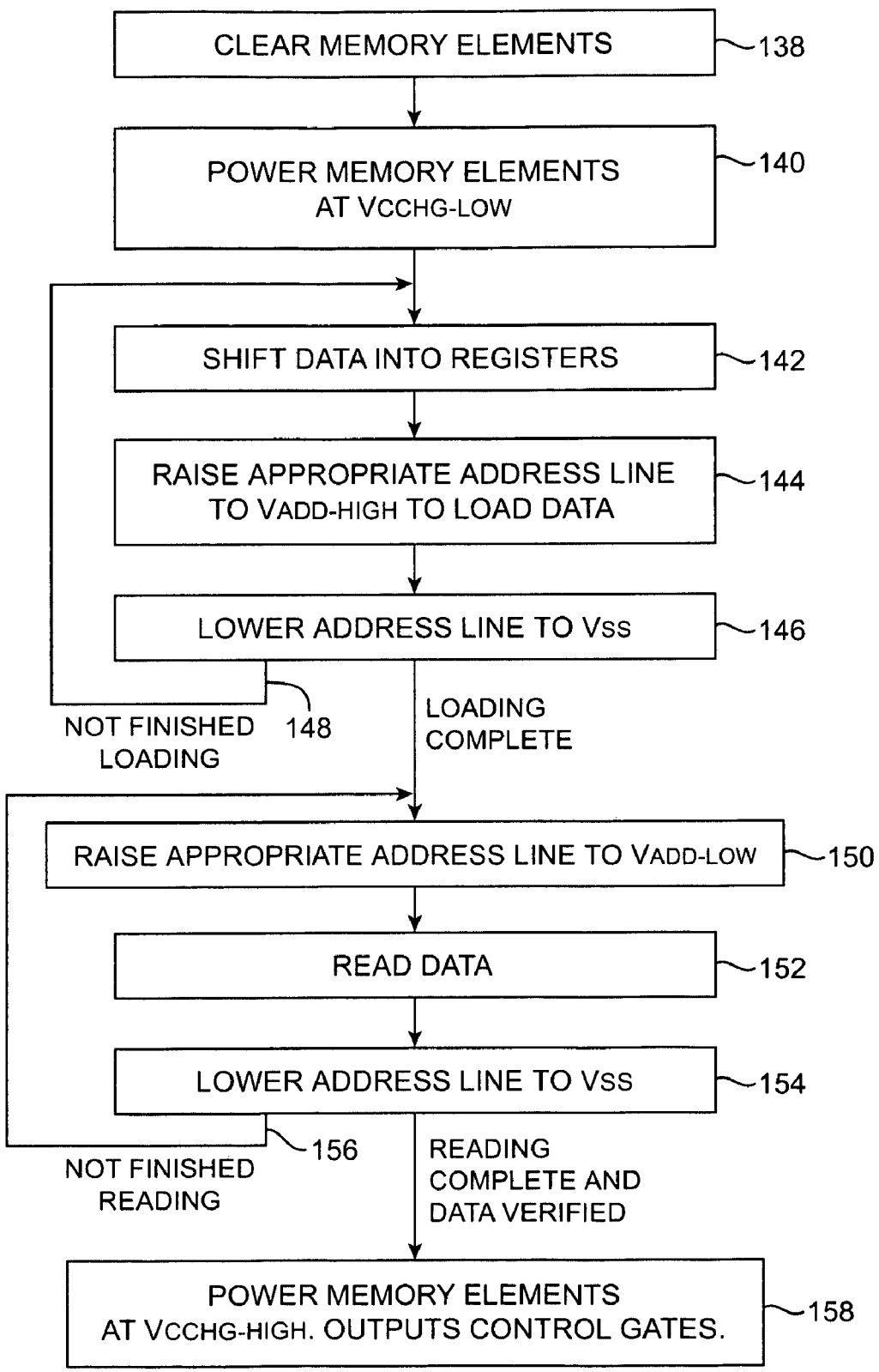
FIG. 13 is a flow chart of illustrative steps involved using an array of programmable logic device memory elements of the type shown in FIG. 7 in accordance with the present invention.

A flow chart of the steps involved in operating memory elements 82 in a programmable logic device integrated circuit 10 is shown in FIG. 13.

At step 138, the memory elements are cleared in preparation for data loading using the clear line 104.

At step 140, the memory elements 82 may be powered using a power supply voltage such as Vcchg-low (e.g., 1.2 volts). As shown in the first trace of FIGS. 9 and 10, this value may have been reduced from an existing relatively higher value of Vcchg-high in preparation for configuration data loading operations. Alternatively, array 88 may be powered up using a positive power supply voltage of Vcchg-low. If array 88 is powered up using Vcchg-low, this relatively low positive power supply voltage may be maintained during data loading operations to facilitate programming.

At step 142, configuration data is shifted into registers 117 of read and write circuitry 115 via input 106 (FIG. 6).

At step 144, control signals are applied to address decoder 102 of FIG. 6 at input 110. The control signals direct the address decoder 102 to assert a desired address line 112 to address a column of memory elements in array 88. In response, one of the address lines 112 in the array is asserted to address a corresponding column of memory elements 82 in array 88. The address signal ADD is preferably taken from a low value of Vss (e.g., 0 volts) to an elevated value of Vcchg-high (e.g., 1.6 volts), as described in connection with FIGS. 9 and 10.

The relatively high value of the elevated ADD signal voltage (e.g., Vcchg-high) and the relatively low value of the memory element array positive power supply voltage (e.g., Vcchg-low) that are used during step 144 help to reduce the real estate requirements for address transistor 132 and/or increase the write margin for the memory elements.

At step 146, after the configuration data for the addressed column of memory elements has been loaded into the array 88 via data lines 108, the address line 112 is deasserted (e.g., by lowering the voltage of the address line from its elevated level of Vcchg-high to a ground voltage of Vss, as described in connection with FIGS. 9 and 10).

As shown by line 148, the configuration data loading process continues until data loading and reading circuitry 96 has systematically asserted all of the address lines 112 in the array 88 and all of the memory elements 82 of the array 88 have been loaded.

Once array 88 has been completely loaded with configuration data, the power regulator circuitry 84 can increase the memory element positive power supply voltage to Vcchg-high in preparation for data confirmation operations.

At step 150, the data loading and reading circuitry 96 asserts one of the address lines 112. The address line 112 is preferably raised in voltage from Vss to a relatively low value Vadd-low (e.g., Vcc) to help improve the read margin of the memory element 82. The data that has been loaded into the addressed column of memory elements is read out of the memory elements by the data loading and reading circuitry 96, as described in connection with FIGS. 11 and 12 (step 152).

At step 154, the address line that was asserted is deasserted by reducing its voltage from Vadd-low to Vss.

As shown by line 156, data read operations continue until the data loading and reading circuitry 96 has systematically read out all of the loaded configuration data from the array 88. The data that has been read out is compared to the data that was loaded. If there is a discrepancy between the loaded data and the data that is read out, corrective actions can be taken.

If the data confirmation process is successful, the programmable logic device integrated circuit 10 may be used in normal operation in a system (step 158). During normal operation, the power regulator circuitry 84 powers the array 88 at a power supply level that is elevated with respect to the power supply level used to power the programmable core logic 18. For example, memory elements 82 may be powered at Vcchg-high and Vss. When powered in this way, the memory elements 82 that contain logic zeros produce control signals at their DATA_OUT terminals at Vss and the memory elements 82 that contain logic ones produce control signals at their DATA_OUT terminals at Vcchg-high. The magnitude of Vcchg-high is larger than the voltage Vcc used to power the programmable core logic 18, which enhances performance.

In the illustrative arrangement described in connection with FIG. 13, the memory array 88 is powered by dynamic power regulator circuitry that provides a time-varying positive power supply voltage of Vcchg and a ground voltage of Vss. The power supply voltage Vcchg is elevated at Vcchg-high during normal operation and during data read operations. The power supply voltage Vcchg is reduced to Vcchg-low during data write operations. In general, Vcchg-high and Vcchg-low may be any suitable voltages. One suitable voltage for Vcchg-low is the readily available power supply voltage Vcc. If desired, however, Vcchg-low may be lower or higher than Vcc. The value of Vcchg-low may be, for example, 1.2 volts, or a lower or higher value may be used. Vcchg-high may be 1.6 volts (e.g., when Vcc is 1.2 volts), may be in the range of 1.2 volts to 1.4 volts, may be in the range of 1.2 volts to 1.6 volts, may be greater than 1.6 volts, or may be less than 1.2 volts (i.e., when Vcc is less than 1.2 volts).

Raising and lowering the value of Vcchg as needed provides benefits such as reduced real estate requirements for the address transistors in the array and increased write margins. If desired, however, a fixed value of Vcchg may be used. For example, the value of Vcchg may be fixed at Vcc or may be fixed at an elevated level (e.g., at 1.6 volts when Vcc is fixed at 1.2 volts). The benefits of using different maximum voltage levels for the address signals during data write operations and data read operations can be obtained regardless of which type of memory element power supply voltage scheme is used.

Proper addressing operations require that the address signal fall within certain ranges. The use of an elevated address signal of Vcchg-high during data write operations and a low signal of Vcc during data read operations is merely illustrative.

In general, when a two-level power supply voltage Vcchg (Vcchg-high/Vcchg-low) is used, an elevated address signal voltage of Vcchg-high is advantageous, because Vcchg-high is already available on the integrated circuit 10. If desired, a high address voltage Vadd-high may be used that is lower or higher than Vcchg-high. Similarly, the use of a data read address signal voltage of Vcc is advantageous when the value of Vcchg-low and the data line signals are at Vcc. If desired, Vadd-low may be lower or higher than Vcc. Vadd-low is generally lower than Vadd-high, so that write margin (and/or address transistor real estate requirements) and read margin can be improved simultaneously.

Elevating the memory element power supply using a positive power supply voltage of Vcchg-high and a ground voltage of Vss is generally satisfactory. If desired, however, elevated power supply voltages can be provided by power regulator circuitry 84 using other arrangements. For example, an elevated power supply level may be provided using a positive power supply voltage at Vcc and a ground power supply voltage that is less than Vss. With this type of arrangement, the memory element power supply voltage is elevated because the difference between the memory element positive power supply voltage and the memory element ground is larger than the different between Vcc and Vss (the power supply levels used to power the circuitry of the programmable core logic 18). The threshold voltages of the metal-oxide-transistors used in integrated circuit 10 (e.g., the memory element transistors) may be modified to accommodate shifted positive and ground power supply voltages if desired.

When a fixed, single-level power supply voltage Vcchg is used for the memory array, the elevated address signal Vadd-high may be greater than Vcchg or less than Vcchg. If the memory element power supply voltage is fixed at Vcc, the address signal Vadd-high used during data write operations may be greater than Vcc. The address signal Vadd-low is generally less than Vadd-high. A Vadd-low level of Vcc is generally suitable, because the voltage Vcc is readily available on the integrated circuit. If desired, however, Vadd-low may be lower or higher than Vcc.

The voltage used for the data signals on DATA_IN lines 108 is typically Vcc, because this is the voltage used by the logic signals in core logic 18. If desired, the data signals may use higher or lower values.

There are threshold voltages Vtn and Vtp associated with the n-channel and p-channel metal-oxide-semiconductor transistors in the inverters of the memory element. Proper operation of the inverters requires that the inverter voltages exceed the sum of Vtn and Vtp. The sum of Vtn and Vtp is sometimes referred to as Vfunction. In general, Vcchg-low must be above Vfunction for the memory element to operate properly. The value of Vadd-low is preferably greater than Vfunction and less than Vcchg-high.

The foregoing is merely illustrative of the principles of this invention and various modifications can be made by those skilled in the art without departing from the scope and spirit of the invention.

What is claimed is:

1. A programmable logic device integrated circuit comprising:
   programmable core logic powered at a core logic power supply voltage;
   an array of memory elements having outputs that configure the programmable core logic;
   a plurality of address lines for addressing the memory elements in the array; and
   data loading and reading circuitry that applies address signals that have a voltage level that is greater than the core logic power supply voltage to the address lines to load programmable logic device configuration data into the memory elements.

2. The programmable logic device integrated circuit defined in claim 1 further comprising:
   power regulator circuitry that provides a time-varying memory element power supply voltage that powers the memory elements, wherein the time-varying memory element power supply voltage is equal to the core logic power supply voltage when the data loading and reading circuitry applies the address signals to the address lines to load the programmable logic device configuration data, and wherein the time-varying memory element power supply voltage is greater than the core logic power supply voltage during normal operation.

3. The programmable logic device integrated circuit defined in claim 1 further comprising power regulator circuitry that powers the memory elements at a memory element power supply voltage that is greater than the core logic positive power supply voltage during normal operation of the memory elements.

4. The programmable logic device integrated circuit defined in claim 1 wherein each memory element comprises cross-coupled inverters and wherein the data loading and reading circuitry applies address signals to the address lines to read programmable logic device configuration data from the memory elements, wherein the address signals used to read the programmable logic device configuration data have a voltage level that is less than the voltage level of the address signals used when loading the programmable logic device configuration data into the memory elements.

5. The programmable logic device integrated circuit defined in claim 1 further comprising a plurality of address transistors, wherein each address transistor is associated with a respective memory element in the array of memory elements and has a gate, wherein the gates are controlled by the address lines, wherein the gates receive address signals at a first voltage level during data write operations in which the programmable logic device configuration data is loaded into the memory elements and receive address signals at a second voltage level during data read operations in which the programmable logic device configuration data is read from the memory elements by the data loading and reading circuitry, wherein the first voltage level is greater than the core logic power supply voltage, and wherein the second voltage level is equal to the core logic power supply voltage.

6. The programmable logic device integrated circuit defined in claim 1 further comprising:
   a plurality of address transistors, wherein each address transistor is associated with a respective memory element in the array of memory elements and has a gate, wherein the gates are controlled by the address lines, wherein the gates receive address signals at a first voltage level during data write operations in which the programmable logic device configuration data is loaded into the memory elements and receive address signals at a second voltage level during data read operations in which the programmable logic device configuration data is read from the memory elements by the data loading and reading circuitry, wherein the first voltage level is greater than the core logic power supply voltage, wherein the second voltage level is equal to the core logic power supply voltage, and
   power regulator circuitry that powers the memory elements at a power supply voltage that is equal to the first voltage level during normal operation of the memory elements.

7. A programmable logic device integrated circuit having programmable logic device memory elements into which configuration data is written during data loading operations and from which configuration data is read during read operations, comprising:
   programmable core logic that is powered at a programmable core logic power supply voltage;
   an array of the memory elements that supply control signals to the programmable core logic during normal operation that configure the programmable core logic; and
   data loading and reading circuitry that produces address signals that address the memory elements at a different voltage level during data loading operations than during read operations.

8. The programmable logic device integrated circuit defined in claim 7 wherein the address signals have a voltage level that is greater than the programmable core logic power supply voltage during data loading operations and that is equal to the programmable core logic power supply voltage during read operations, the programmable logic device integrated circuit further comprising power regulator circuitry that powers the memory elements at a memory element power supply voltage.

9. The programmable logic device integrated circuit defined in claim 7 wherein the address signals have a voltage level that is greater than the programmable core logic power supply voltage during data loading operations and that is equal to the programmable core logic power supply voltage during read operations, the programmable logic device integrated circuit further comprising power regulator circuitry that powers the memory elements at a memory element power supply voltage that is equal to the voltage level of the address signals during data loading operations.

10. The programmable logic device integrated circuit defined in claim 7 wherein the address signals have a voltage level that is greater than the programmable core logic power supply voltage during data loading operations and that is equal to the programmable core logic power supply voltage during read operations, the programmable logic device integrated circuit further comprising dynamic power regulator circuitry that produces a time-varying memory element power supply voltage having first and second voltage levels, wherein the first voltage level is produced during data loading operations, wherein the second voltage level is produced during normal operation, wherein the first voltage is equal to the programmable core logic power supply voltage, and wherein the second voltage level is greater than the first voltage.

11. A method for using an array of programmable logic device memory elements on a programmable logic device integrated circuit, wherein programmable logic device configuration data is written to the memory elements during data loading operations and wherein the programmable logic device configuration data is read from the memory elements during data read operations, the method comprising:
   applying address signals to the array of programmable logic device memory elements that have different voltage levels during data loading operations and data read operations; and
   during normal operation, after the programmable logic device memory elements have been loaded with the programmable logic device configuration data, applying output signals from the programmable logic device memory elements to programmable core logic on the programmable logic device integrated circuit to configure the programmable core logic.

12. The method defined in claim 11 wherein applying the address signals comprises applying address signals during data loading operations that have a voltage level that is larger than the voltage level of the address signals during data read operations.

13. The method defined in claim 11 wherein applying the address signals comprises applying address signals during data loading operations that have a first voltage level and applying address signals during data read operations that have a second voltage level, wherein the first voltage level is larger than the second voltage level, the method further comprising:
   powering the programmable core logic at a programmable core logic power supply voltage that is equal to the second voltage level.

14. The method defined in claim 11 wherein applying the address signals comprises applying address signals during data loading operations that have a first voltage level and applying address signals during data read operations that have a second voltage level, wherein the first voltage level is larger than the second voltage level, the method further comprising:
   powering the programmable core logic at a programmable core logic power supply voltage that is equal to the second voltage level; and
   during normal operation, powering the memory elements with a power supply voltage that is greater than the programmable core logic power supply voltage.

15. The method defined in claim 11 further comprising:
powering the programmable core logic at a programmable core logic power supply voltage; and
during normal operation, powering the memory elements with a power supply voltage that is greater than the programmable core logic power supply voltage.

16. The method defined in claim 11 further comprising:
powering the programmable core logic at a programmable core logic power supply voltage;
during normal operation, powering the memory elements with a power supply voltage that is greater than the programmable core logic power supply voltage; and
during data loading operations, powering the memory elements with a power supply voltage that is less than the power supply voltage used to power the memory elements during normal operation.

17. The method defined in claim 11 further comprising:
powering the programmable core logic at a programmable core logic power supply voltage;
during normal operation, powering the memory elements with a power supply voltage that is greater than the programmable core logic power supply voltage; and
during data loading operations, powering the memory elements with a power supply voltage that is equal to the programmable core logic power supply voltage.

18. The method defined in claim 11 wherein each memory element comprises two cross-coupled inverters each of which has a p-channel metal-oxide-semiconductor transistor and an n-channel metal-oxide-semiconductor transistor connected in series between a positive power supply terminal and a ground terminal, the method further comprising:
powering the programmable core logic at a programmable core logic power supply voltage; and
during normal operation, powering the memory elements with a power supply voltage that is greater than the programmable core logic power supply voltage by applying a positive power supply voltage at the positive power supply terminal and a ground voltage at the ground terminal, wherein the voltage level of the address signals during data writing operations is equal to the positive power supply voltage.

19. The method defined in claim 11 wherein applying the address signals comprises applying address signals during data loading operations that have a first voltage level and applying address signals during data read operations that have a second voltage level, wherein the first voltage level is larger than the second voltage level, the method further comprising:
powering the programmable core logic at a programmable core logic power supply voltage; and
during normal operation, powering the memory elements with a power supply voltage that is greater than the programmable core logic power supply voltage and that is equal to the first voltage level.

20. The method defined in claim 11 wherein applying the address signals comprises applying address signals during data loading operations that have a first voltage level and applying address signals during data read operations that have a second voltage level, wherein the first voltage level is larger than the second voltage level, the method further comprising:
powering the programmable core logic at a programmable core logic power supply voltage that is equal to the second voltage level; and
during normal operation, powering the memory elements with a power supply voltage that is greater than the programmable core logic power supply voltage and that is equal to the first voltage level.

* * * * *